United States Patent [19]

Barton et al.

[11] Patent Number: 4,469,772

[45] Date of Patent: Sep. 4, 1984

[54] WATER DEVELOPABLE DYE COATING ON SUBSTRATE WITH TWO DIAZO POLYCONDENSATION PRODUCTS AND WATER SOLUBLE POLYMERIC BINDER

[75] Inventors: Oliver A. Barton, Florham Park; James D. Wright, Basking Ridge, both of N.J.

[73] Assignee: American Hoechst Corporation, Somerville, N.J.

[21] Appl. No.: 458,408

[22] Filed: Jan. 17, 1983

Related U.S. Application Data

[63] Continuation-in-part of Ser. No. 384,457, Jun. 3, 1983, abandoned.

[51] Int. Cl.³ .......................... G03C 1/54; G03C 1/60; G03F 3/00
[52] U.S. Cl. .................................. 430/163; 430/143; 430/157; 430/172; 430/175; 430/176; 430/177; 430/293
[58] Field of Search ............... 430/175, 163, 176, 177, 430/172, 28, 157, 293, 143

[56] References Cited

U.S. PATENT DOCUMENTS 3,679,419  7/1972  Gillich ................................. 430/175
3,836,366  9/1974  Silver ................................... 430/172
3,849,392  11/1974 Steppan .
3,867,147  2/1975  Teuscher ............................. 430/175
3,915,707  10/1975 Gesswein ............................ 430/28
4,092,170  5/1978  Houtermans et al. .............. 430/175
4,288,520  9/1981  Sprintschnik ...................... 430/175

FOREIGN PATENT DOCUMENTS 56-121031  9/1981  Japan .................................. 430/172
1312926    4/1973  United Kingdom ................ 430/175

Primary Examiner—Charles L. Bowers, Jr.
Attorney, Agent, or Firm—Richard S. Roberts

[57] ABSTRACT

The invention provides a photographic element having a substrate and a photosensitive coating on the substrate, said coating containing (A) the polycondensation product of 3-methoxy-4-diazodiphenyl amine sulfate and 4,4'-bis-methoxy methyldiphenyl ether, precipitated as methane sulfonate; and, (B) the polycondensation product of 3-methoxy-4-diazodiphenyl amine sulfate and 4,4'-bis-methoxy methyldiphenyl ether, precipitated as mesitylene sulfonate, and (C) at least one colorant: and (D) at least one water soluble polymeric binding resin which is preferably polyvinyl pyrrolidone. The element is developable using water alone as a solvent.

13 Claims, No Drawings

WATER DEVELOPABLE DYE COATING ON SUBSTRATE WITH TWO DIAZO POLYCONDENSATION PRODUCTS AND WATER SOLUBLE POLYMERIC BINDER

CROSS REFERENCE TO RELATED APPLICATION

This application is a continuation in part of co-pending U.S. patent application Ser. No. 06/384,457 filed June 3, 1983, abandoned.

BACKGROUND OF THE INVENTION

This invention relates to novel compositions of matter useful as lithographic photosensitizers. More specifically, the present invention relates to novel lithographically suitable diazo photosensitizers useful in the manufacture of color proofing guides. Still more particularly, the instant invention relates to novel lithographic photosensitizers which when blended with a suitable dye and a compatible resin in an acceptable solvent system, form compositions which when applied to transparent substrates form commercially satisfactory color proofing guides for use by lithographers. The photosensitizers of the instant invention are beneficial in that they are substantially developable with water.

The art of producing good quality color lithographic reproduction depends upon a multitude of factors, one of which is the selection of the proper tones to match the colors of the original image. It has, therefore, been found highly desirable to provide the lithographer with an inexpensive means for comparing the image which he intends to reproduce with the original image before he has begun a press run. To this end it is known to manufacture color proofing guides which the lithographer can use a priori to evaluate the quality of his image and make any required adjustments before beginning production. Typically, these color proofing guides are comprised of a photosensitive composition and a dye, usually having a cyan, magenta, yellow or black color, which has been coated upon a transparent substrate. Upon exposure of the color proofing guide to the original image and development by standard techniques known to the skilled worker, a transparent image is produced which corresponds to one of the colors of the original image. A color proofing guide is made for each of the above mentioned primary colors to produce a series of transparencies each possessing one color of the original image. When these transparencies are superimposed an image is formed which closely approximates that of the original image.

The lithographer may then compare his proof image with that of the original image and make any adjustments necessary to more closely match the original image before proceeding with actual printing. Such changes which can be made include altering exposures and halftone patterns.

A problem with this method has been that the photosensitive compositions typically employed in the manufacture of these color proofing guides have required development using environmentally undesirable solvents, caustics and other similar ingredients. It has long been desired to produce such a color proofing guide which is developable to a commercially acceptable extent using common tapwater. Unfortunately, this has not been possible heretofore. Severe development problems and poor image quality have been noted when those skilled in the art have attempted to produce such images by developing with water.

The present invention provides a photosensitive composition useful for color proofing guides which are easily developable with water, demonstrate good wet adhesion and have minimal background staining even after the composition has been heated for drying purposes during the manufacturing process. The composition employs two diazo compounds, the combination of which demonstrates the aforementioned benefits even though the individual diazo compounds do not have such beneficial properties.

SUMMARY OF THE INVENTION

The invention provides a photographic element comprised of a substrate and a photosensitive coating on said substrate, said coating comprising
 (a) the polycondensation product of 3-methoxy-4-diazodiphenyl amine sulfate and 4,4'-bis-methoxy methyl-diphenyl ether, precipitated as methane sulfonate; and,
 (b) the polycondensation product of 3-methoxy-4-diazodiphenyl amine sulfate and 4,4'-bis-methoxy methyl-diphenyl ether, precipitated as mesitylene sulfonate, and
 (c) at least one colorant; and
 (d) at least one water soluble polymeric binding resin.

DETAILED DESCRIPTION OF THE PREFERRED EMBODIMENT

In the preferred embodiment, the substrate employed is transparent and preferably is composed of polyethylene terephthalate. The surface of the substrate may optionally be treated by means known in the art to improve surface characteristics such as adhesion. Such treatment means include coating with acrylics or polyvinylidene chloride.

In the production of the light sensitive coating composition, two distinct light sensitive components are employed. These are:
 Diazo 1:
 the polycondensation product of 3-methoxy-4-diazodiphenyl amine sulfate and 4,4'-bis-methoxy methyl-diphenyl ether, precipitated as methane sulfonate; and,
 Diazo 2
 the polycondensation product of 3-methoxy-4-diazodiphenyl amine sulfate and 4,4'-bis-methoxy methyl-diphenyl ether, precipitated as mesitylene sulfonate, and It has been unexpectedly found that when a combination of both of these compounds are incorporated into the coating composition, the aforementioned beneficial properties are noticed whereas such benefits are not noticed if either of the light sensitive elements is omitted.

The coating composition also includes at least one water soluble polymeric binding resin. In the preferred embodiment this resin is polyvinyl pyrrolidone and in a more preferred embodiment has an average molecular weight in the range of about 60,000 to 300,000. The coating also contains at least one compatible colorant which is preferably a dye. The selection of most useful colorant and resin is easily within the skill of the knowledgable artisan.

Although color proofing guides may be produced in a multitude of color coatings the most advantageous for lithographic purposes are yellow, magenta, cyan and black.

In the preferred embodiment, the ratio of diazo 1 to diazo 2 runs from about 1:3.5 to about 3.5:1, more preferably 1:1 to 1:3.5.

The amount of total diazo in the coating composition preferably is in the range of from about 6 to about 60 dry parts by weight or more preferably from about 10 to about 32 dry parts by weight.

The amount of total colorant in the coating composition preferably is in the range of from about 3 to about 60 dry parts by weight or more preferably from about 4 to about 33 dry parts by weight.

The amount of resin in the coating composition preferably is in the range of from about 33 to about 87 dry parts by weight, or more preferably from about 33 to about 67 dry parts by weight.

The balance of the coating is sufficient solvent composition to effectively dissolve and apply the coating composition. The solvent composition is dried off after the coating is applied, however, some residual solvent may remain in the coating.

The preferred amount of coating applied to the substrate is from about 0.025 g/square meter of substrate to about 10 g/M$^2$ or more preferably from about 0.05 g/M$^2$ to about 2.0 g/M$^2$.

The preferred colorants are dyes and the most preferred dyes are Victoria Pure Blue FGA, Rhodamine FB and Calcozine Yellow and combinations of these.

The coating ingredients are preferably mixed with a solvent composition capable of incorporating the individual elements into a homogeneous solution. Suitable solvents include methyl Cellosolve, ethyl Cellosolve, methyl ethyl ketone, propanol, isopropanol, methyl pentyl ketone, methyl butyl ketone and methanol. The preferred solvent composition comprises a 1:1 mixture of methyl Cellosolve and methyl ethyl ketone.

The coating may also contain minor amounts of other optional ingredients such as stabilizers, as are well known to the skilled artisan, for example p-toluene sulfonic acid.

The following examples illustrate the benefits of the present invention:

EXAMPLE 1

The following coating formulations are prepared by blending all ingredients at standard room conditions.

| Component | Solution A | B | A + B |
|---|---|---|---|
| Methyl Cellosolve/Methyl Ethyl Ketone (1:1) | 95.0 g | 95.0 g | 95.0 g |
| Victoria Pure Blue FGA (BASF) | .5 g | .5 g | .5 g |
| Polyvinyl pyrrolidone (K-60) (GAF) | 4.0 g | 4.0 g | 4.0 g |
| Diazo #1 | .5 g | 0 | .025 g |
| Diazo #2 | 0 | .5 g | .025 g |

Solutions A, B and A+B are coated on sample sheets of Melinex 505 (ICI) polyethylene terephthalate to a standard density (16–20 Gardner scale) and then dried and heated for 3 minutes at 60° C. The coatings are then exposed through a negative for 20 exposure units on a Berkey-Ascor exposure apparatus and developed with water. It is noted that sample A does not develop with water. Sample B would only develop with water when rubbed but sample A+B develops when only sprayed with water and still gives good wet image adhesion to the substrate.

EXAMPLE 2

Example 1 is repeated using the following solids coating composition:

| | |
|---|---|
| Polyvinyl pyrrolidone (K-60) (GAF) | 600.0 g |
| Polyvinyl pyrrolidone (K-90) (GAF) | 175.0 g |
| Victoria Pure Blue FGA (BASF) | 160.0 g |
| Diazo 1 | 180.0 g |
| Diazo 2 | 500.0 g |
| p-toluene sulfonic acid | 7.5 g |

The solution is coated to a standard density of (cyan filter) 1.25–1.30 and dried at 150° F. The coating is exposed and water developed with a very light wiping to give a product which is completely developed and demonstrates excellent wet image adhesion.

EXAMPLE 3

The following compositions are formed according to the procedure of Example 1 by whirler coating the coating on the substrate for 2 minutes and post treating for 4 minutes at 100° C.

| Component | Solution A | B | A + B |
|---|---|---|---|
| Methyl Cellosolve/Methyl Ethyl Ketone (1:1) | 93.4 g | 93.4 g | 93.4 g |
| Victoria Pure Blue FGA | .6 g | .6 g | .6 g |
| Polyvinyl pyrrolidone | 4.0 g | 4.0 g | 4.0 g |
| Diazo #1 | 3.0 g | 0 | 1.5 g |
| Diazo #2 | 0 | 3.0 g | 1.5 g |

Sample A scums when water development is attempted. Sample B requires rubbing for development and still has visible staining although wet image adhesion is very good. Sample A+B easily develops with a water spray, has minimal background staining and has good wet image adhesion.

EXAMPLE 4

The following compositions are formulated, coated without heat treatment, exposed and developed:

| Component | Solution A | B | A + B |
|---|---|---|---|
| Methyl Cellosolve/Methyl Ethyl Ketone (1:1) | 92.2 g | 92.2 g | 92.2 g |
| Polyvinyl pyrrolidone | 1.0 g | 1.0 g | 1.0 g |
| Victoria Pure Blue FGA | 1.0 g | 1.0 g | 1.0 g |
| Rhodamine FB | .6 g | .6 g | .6 g |
| Calcozine Yellow | .6 g | .6 g | .6 g |
| Diazo #1 | 4.0 g | 0 | 2.0 g |
| Diazo #2 | 0 | 4.0 g | 2.0 g |

Sample A spray developed with water spraying but had poor wet image adhesion. Sample B would not completely develop with water. Sample A+B developed with a water spray and a light rub, had minimal staining and good wet image development.

It is, of course, to be understood that the foregoing disclosure is intended to illustrate the invention and that numerous changes can be made in the ingredients, conditions and proportions set forth without departing from the scope of the invention as disclosed and defined in the claims appended hereafter.

What is claimed is:

1. A photographic element comprised of a substrate and a photosensitive coating on said substrate, said coating comprising
   (A) the polycondensation product of 3-methoxy-4-diazodiphenyl amine sulfate and 4,4'-bis-methoxy methyldiphenyl ether, precipitated as methane sulfonate; and,
   (B) the polycondensation product of 3-methoxy-4-diazodiphenyl amine sulfate and 4,4'-bis-methoxy methyldiphenyl ether, precipitated as mesitylene sulfonate, and
   (C) at least one colorant: and
   (D) at least one water soluble polymeric binding resin; and wherein
the ratio of component A to component B is in the range of from about 1:3.5 to 3.5:1; and the amount of total diazo in the coating is in the range of from about 6% to about 60% by weight; and the amount of colorant is in the range of from about 3% to about 60% by weight; and the amount of resin is in the range of from about 33% to about 87% by weight; and wherein the photosensitive coating, after light exposure, is capable of being developed with water alone or with light rubbing.

2. The element of claim 1 wherein said binding resin comprises polyvinyl pyrrolidone.

3. The element of claim 1 wherein said colorant comprises one or more dyes selected from the group consisting of Victoria Pure Blue FGA, Rhodamine FB and Calconize Yellow.

4. The element of claim 2 wherein said colorant comprises one or more dyes selected from the group consisting of Victoria Pure Blue FGA, Rhodamine FB and Calcozine Yellow.

5. The element of claim 1 wherein the ratio of component A to component B ranges from about 1:1 to 1:3.5.

6. The element of claim 1 wherein the ratio of component B to component A ranges from about 1:1 to 1:3.5.

7. The element of claim 1 wherein the total amount of diazo ranges from about 6% to about 60% of the dry coating composition.

8. The element of claim 1 wherein the amount of colorant ranges from about 3% to 60% of the dry coating composition.

9. The element of claim 1 wherein the amount of resin ranges from about 33% to 87% of the dry coating composition.

10. The element of claim 2 wherein the average molecular weight of said polyvinyl pyrrolidone is in the range of from about 60,000 to about 300,000.

11. The element of claim 4 wherein the average molecular weight of said polyvinyl pyrrolidone is in the range of from about 60,000 to about 300,000.

12. The composition of claim 1 wherein said substrate is transparent.

13. The composition of claim 1 wherein said substrate comprises polyethylene terephthalate.

* * * * *